(12) United States Patent
Colinge et al.

(10) Patent No.: US 9,006,829 B2
(45) Date of Patent: Apr. 14, 2015

(54) ALIGNED GATE-ALL-AROUND STRUCTURE

(75) Inventors: Jean-Pierre Colinge, Hsin-Chu (TW); Kuo-Cheng Ching, Hsin-Chu (TW); Zhiqiang Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 141 days.

(21) Appl. No.: 13/594,190

(22) Filed: Aug. 24, 2012

(65) Prior Publication Data
US 2014/0054724 A1 Feb. 27, 2014

(51) Int. Cl.
| H01L 29/78 | (2006.01) |
| H01L 29/423 | (2006.01) |
| H01L 29/786 | (2006.01) |
| H01L 29/165 | (2006.01) |
| H01L 29/66 | (2006.01) |

(52) U.S. Cl.
CPC ......... *H01L 29/42392* (2013.01); *H01L 29/165* (2013.01); *H01L 29/66545* (2013.01); *H01L 29/785* (2013.01); *H01L 29/78696* (2013.01)

(58) Field of Classification Search
USPC ........................................................ 257/353
See application file for complete search history.

(56) References Cited

U.S. PATENT DOCUMENTS

| 6,921,700 B2 * | 7/2005 | Orlowski et al. ............. 438/283 |
| 7,005,330 B2 | 2/2006 | Yeo et al. |
| 7,439,594 B2 * | 10/2008 | Mouli ........................... 257/390 |
| 7,452,778 B2 | 11/2008 | Chen et al. |
| 7,863,674 B2 | 1/2011 | Yeo et al. |
| 2004/0198003 A1 | 10/2004 | Yeo et al. |
| 2007/0181959 A1 * | 8/2007 | Park et al. ..................... 257/401 |
| 2010/0317184 A1 | 12/2010 | Yao et al. |

OTHER PUBLICATIONS

Ernst, et al., "Novel Si-based nanowire devices: Will they serve ultimate MOSFETs scaling or ultimate hybrid integration?", 2008, pp. 745-748, ieeexplore.ieee.org/xpls/abs_all.jsp?arnumber=4796804.
Bangsaruntip, et al., "High Performance and Highly Uniform Gate-All-Around Silicon Nanowire MOSFETs with Wire Size Dependent Scaling", 2009, pp. 297-300, ieeexplore.ieee.org/xpls/abs_all.jsp?arnumber=5424364.

* cited by examiner

*Primary Examiner* — Jerome Jackson, Jr.
(74) *Attorney, Agent, or Firm* — Haynes and Boone, LLP

(57) ABSTRACT

Among other things, a semiconductor device comprising an aligned gate and a method for forming the semiconductor device are provided. The semiconductor device comprises a gate formed according to a multi-gate structure, such as a gate-all-around structure. A first gate portion of the gate is formed above a first channel of the semiconductor device. A second gate portion of the gate is formed below the first channel, and is aligned with the first gate portion. In an example of forming the gate, a cavity is etched within a semiconductor layer formed above a substrate. A dielectric layer is formed around at least some of the cavity to define a region of the cavity within which the second gate portion is to be formed in a self-aligned manner with the first gate portion. In this way, the semiconductor device comprises a first gate portion aligned with a second gate portion.

19 Claims, 9 Drawing Sheets

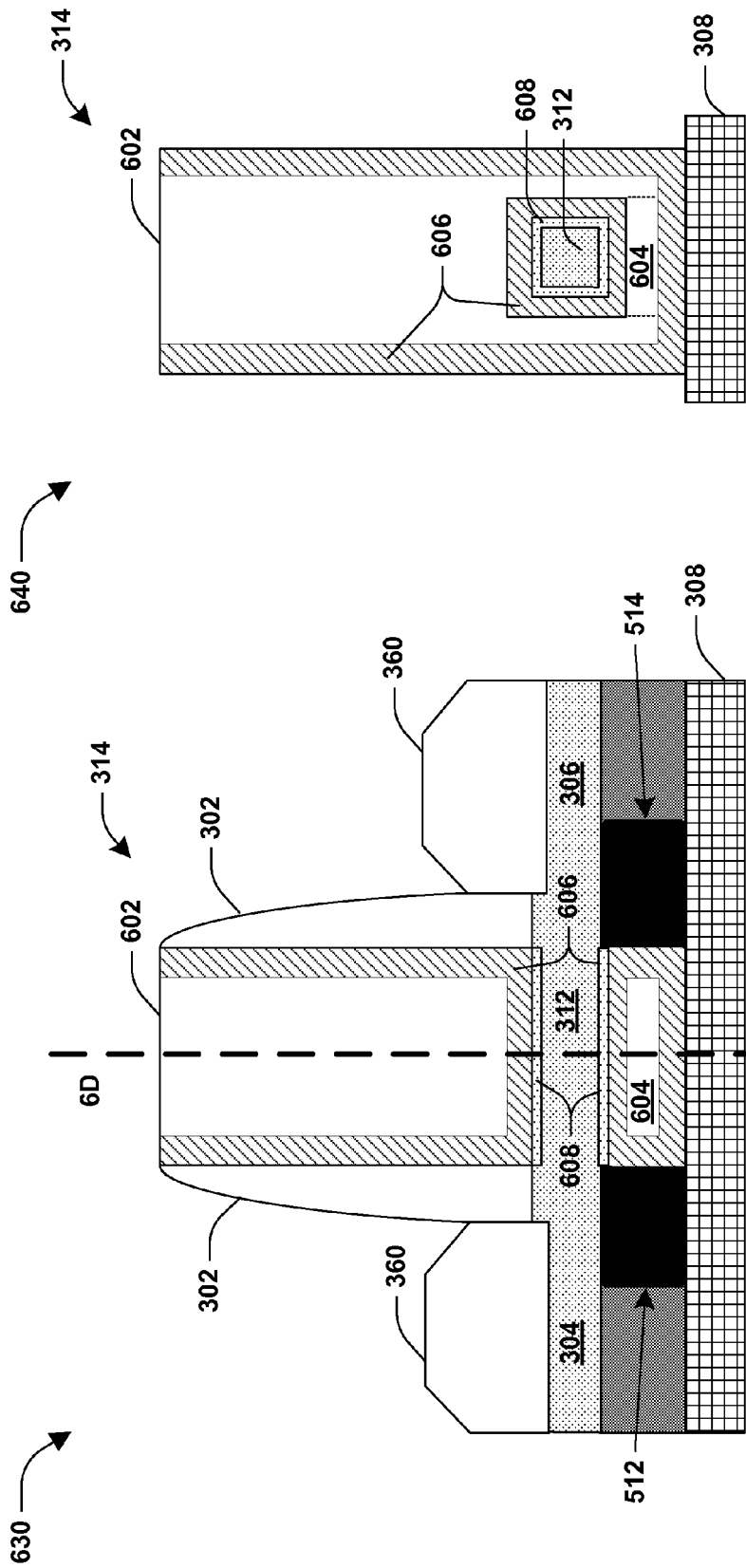

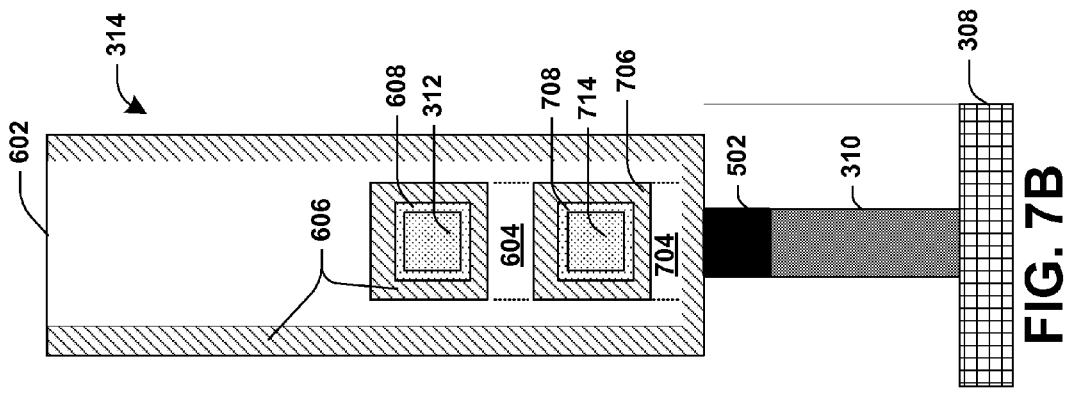
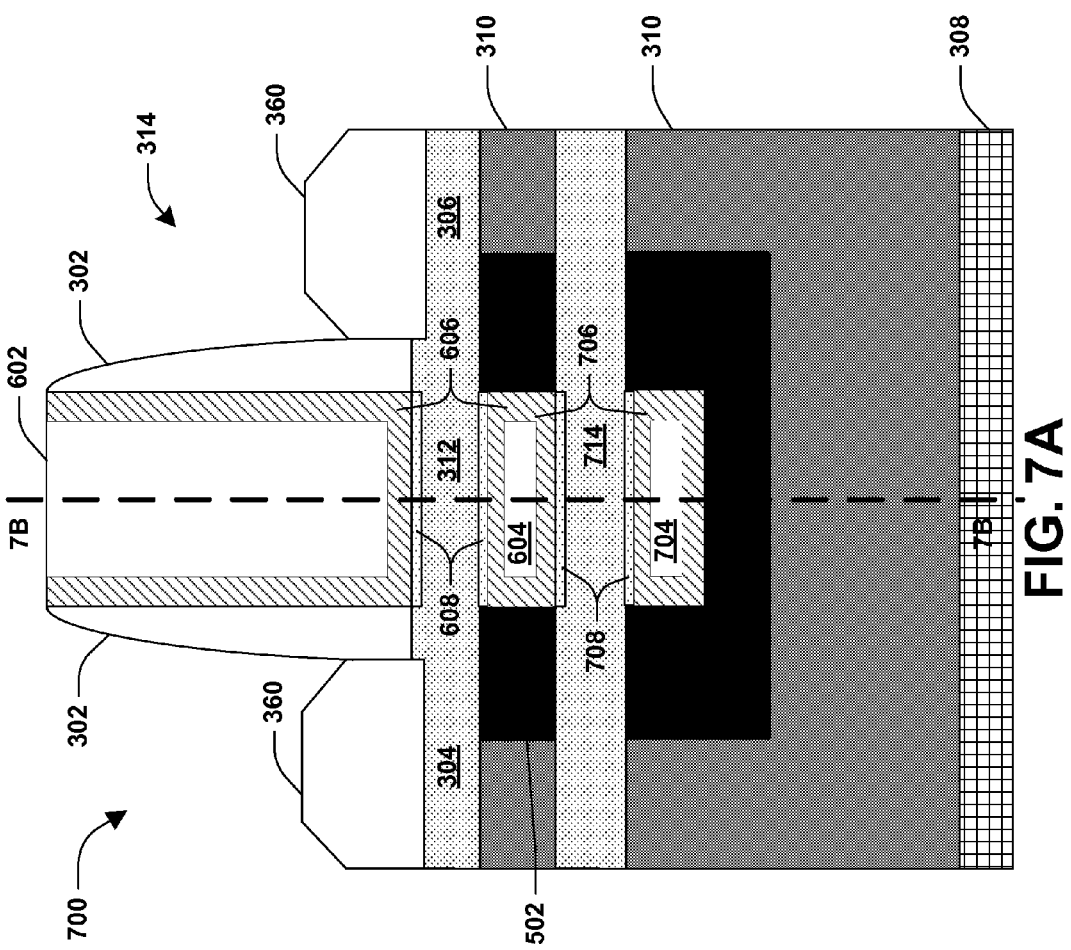

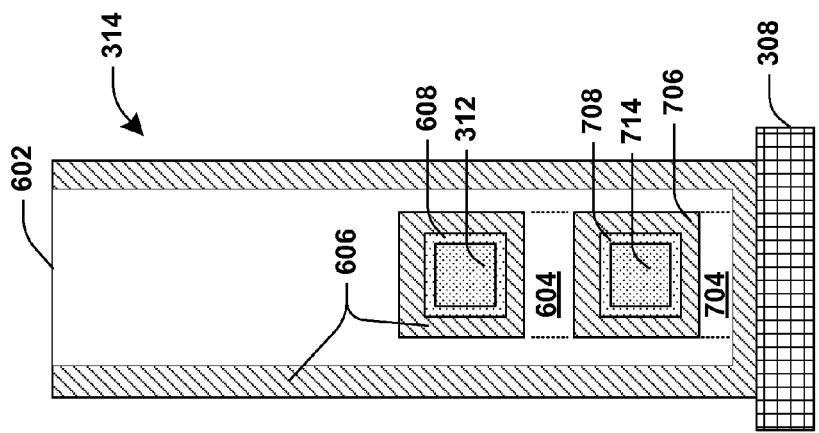
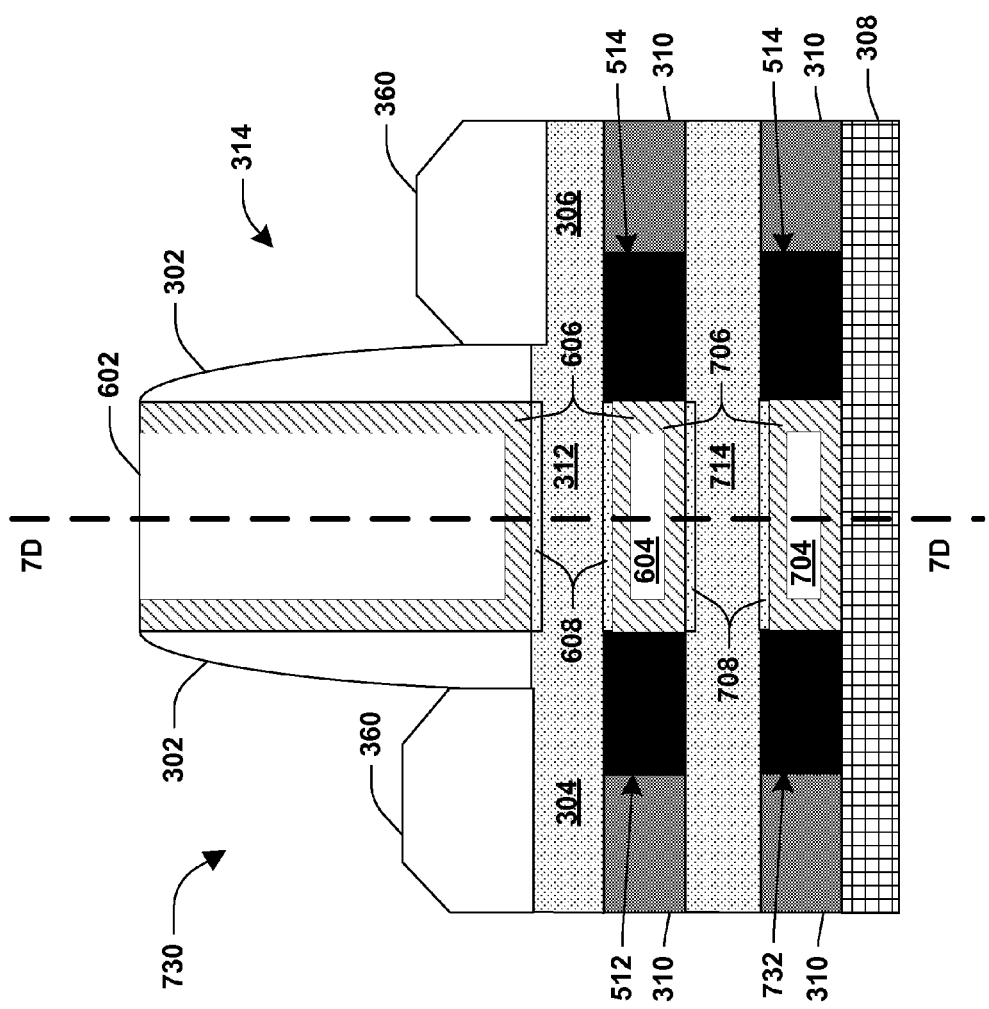
FIG. 7D
FIG. 7C

ALIGNED GATE-ALL-AROUND STRUCTURE

BACKGROUND

To achieve an increase in circuit density of integrated circuits, the size of semiconductor devices, such as field-effect transistors, within such integrated circuits has decreased. Decreasing the size of a semiconductor device can, however, result in a reduction in the length of a channel of the semiconductor device. Reducing the channel length can result in a source region and a drain region of the semiconductor device being closer to one another, which can allow the source and drain region to exert undue influence over the channel, or rather over carriers within the channel, commonly referred to as short-channel effects. Consequently, a gate of a semiconductor device that suffers from short-channel effects has reduced control over the channel, which, among other things, inhibits the ability of the gate to control on and/or off states of the semiconductor device.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

FIG. 6C is an illustration of a semiconductor device comprising a second gate portion aligned with a first gate portion, according to some embodiments.

FIG. 6D is an illustration of a cross-sectional view of a semiconductor device taken along line 6D-6D of FIG. 6C, according to some embodiments.

FIG. 7A is an illustration of a semiconductor device comprising a third gate portion aligned with a second gate portion and a first gate portion, according to some embodiments.

FIG. 7B is an illustration of a cross-sectional view of a semiconductor device taken along line 7B-7B of FIG. 7A, according to some embodiments.

FIG. 7C is an illustration of a semiconductor device comprising a third gate portion aligned with a second gate portion and a first gate portion, according to some embodiments.

FIG. 7D is an illustration of a cross-sectional view of a semiconductor device taken along line 7D-7D of FIG. 7C, according to some embodiments.

DETAILED DESCRIPTION

Figure 1:
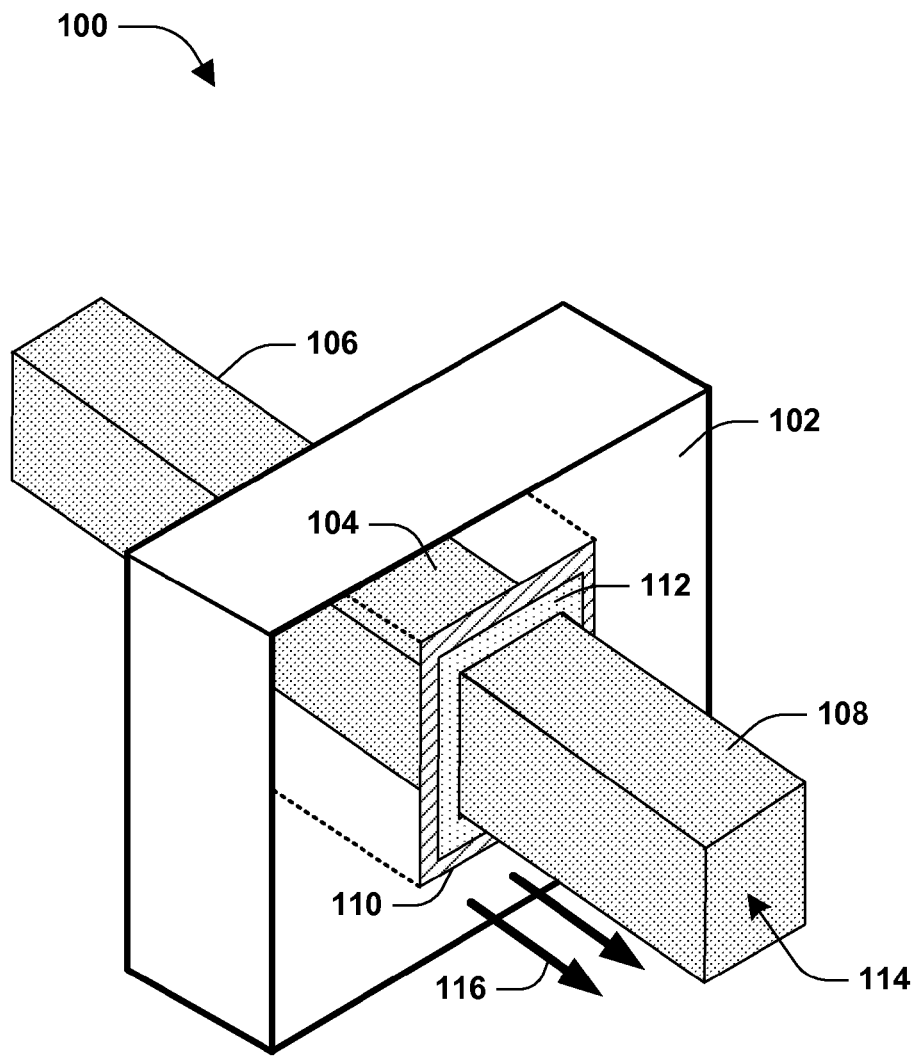
FIG. 1 is an illustration of a conventional semiconductor device comprising a gate formed according to a gate-all-around (GAA) structure, according to some embodiments.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It will be evident, however, that the claimed subject matter may be practiced without these specific details. In other instances, structures and devices are illustrated in block diagram form in order to facilitate describing the claimed subject matter.

Multiple-gate transistors, such as a fin type field effect transistor (FFinFET), mitigate short channel effects by using more gate material to exert control over the channel. In an embodiment, a FinFET device comprises a gate-all-around (GAA) structure where the gate is formed around and thus surrounds the channel of the device. That is, the gate of the FinFET device is formed around an upper surface of the channel, a first lateral surface of the channel, a lower surface of the channel, and a second lateral surface of the channel. By surrounding the channel, the gate can exert more control over the channel and better control on and/or off states of the device, among other things, even in view of short channel effects.

FIG. 1 illustrates an example 100, in accordance with an embodiment of a conventional semiconductor device comprising a gate 102 formed according to a gate-all-around (GAA) structure. The semiconductor device comprises a semiconductor fin 114, such as a silicon fin. A first portion 106 of the semiconductor fin 114 is formed as a source region for the semiconductor device. A second portion 108 of the semiconductor fin 114 is formed as a drain region for the semiconductor device. In an embodiment, the first portion 106 is doped with p-type or n-type dopant to form the source region, and the second portion 108 is doped with n-type or p-type dopants to form the drain region. A middle portion 104 of the semiconductor fin 114 is formed as a channel for the semiconductor device. The channel is formed within the middle portion 104 that is between the first portion 106 and the second portion 108, and is thus situated between the source region and the drain region of the semiconductor device.

An interfacial layer 112 is formed around the channel. For example, the interfacial layer 112 comprises a gate oxide, such as silicon oxide. The interfacial layer 112 provides an interface between the channel and a high k dielectric layer 110, which is formed around the interfacial layer 112. The high k dielectric layer 110 and the interfacial layer 112 insulate the channel from the gate 102.

The gate 102 is substantially formed around the channel. That is, the gate 102 is formed according to a gate-all-around structure, where the gate 102 substantially surrounds an upper surface, a lower surface, a first lateral surface, and a second lateral surface of the channel 114. For example, the gate 102 wraps completely around at least some of the channel 114. During formation of the gate 102, a first gate portion of the gate 102 is formed above the channel 114 and a second gate portion is formed below the channel 114. Unfortunately, the second gate portion does not self align with the first gate portion. That is, the second gate portion extends 116 past the channel, such as under at least some of the source region 106 and/or under at least some of the drain region 108. In this way, the second gate portion can extend 116 over a substantial portion of a substrate upon which the semiconductor device is formed, which results in a relatively large parasitic capacitance between the gate 102 and the substrate. A parasitic capacitance also develops between the source region and the second gate portion and between the drain region and the second gate region when the second gate portion extends under the source region and the drain region.

Figure 2:
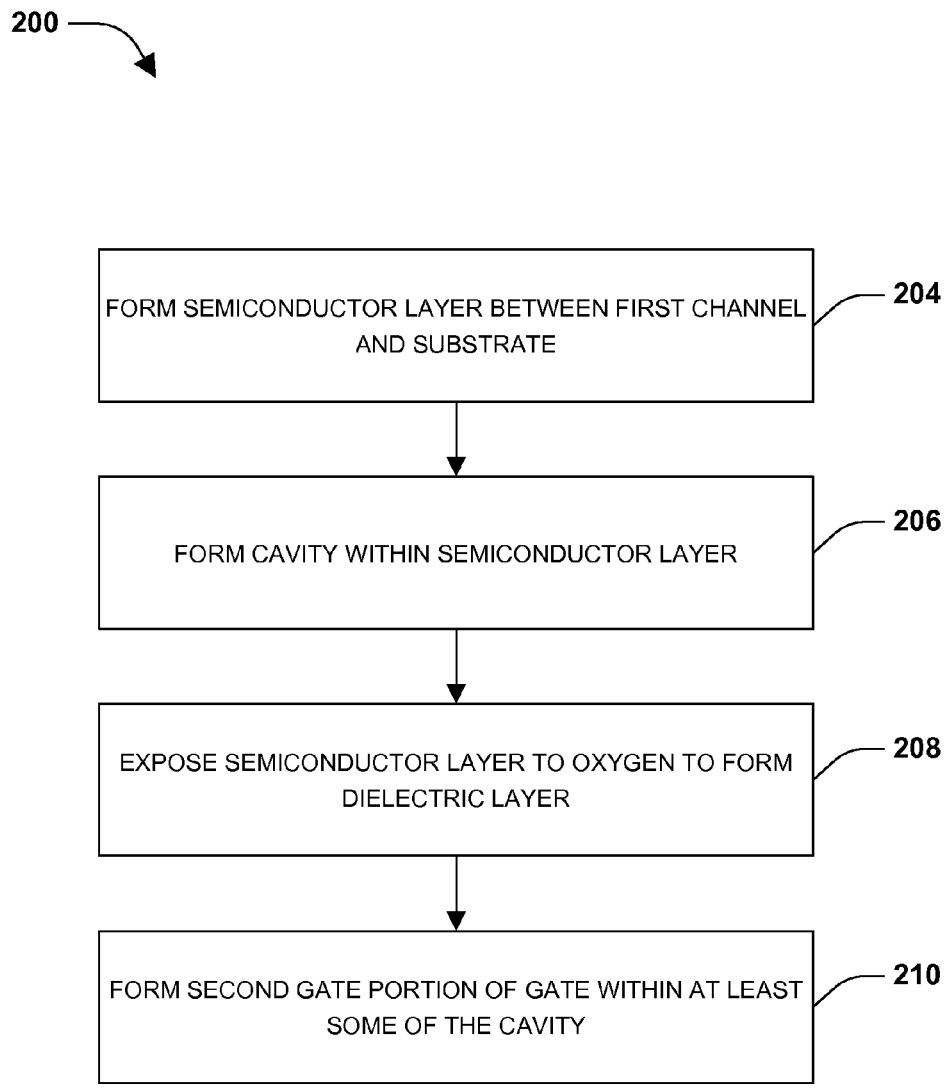
FIG. 2 is a flow diagram illustrating a method of forming a semiconductor device with an aligned gate, according to some embodiments.

Accordingly, an embodiment of forming a semiconductor device with an aligned gate is illustrated by an exemplary method 200 in FIG. 2 and exemplary semiconductor devices formed by such a methodology are illustrated in FIGS. 3-7D. A semiconductor device 314, such as a FinFET device, a tri-gate device, etc., is formed over a substrate 308. The semiconductor device 314 comprises a first channel 312. For example, the first channel 312 is formed within a semiconductor fin of the semiconductor device 314. The first channel 312 is formed between a source region 304 and a drain region 306 of the semiconductor device 314, where epitaxial regions 360 overlie the source 304 and drain 306 regions. The semiconductor fin extends through a gate of the semiconductor device 314. For example, the semiconductor fin extends through a gate-all-around structure, such that a first gate portion 602 of the gate is formed above the first channel 312, a second gate portion 604 of the gate is formed below the first channel 312, a first lateral gate portion of the gate is formed on a first lateral side of the first channel 312, and a second lateral gate portion of the gate is formed on a second lateral side of the first channel 312. In this way, the gate wraps substantially around at least some of the first channel 312, which provides the gate with improved control over the first channel 312, such as to mitigate short-channel effects, for example. If the second gate portion 604 of the gate is not aligned with the first gate portion 602 of the gate, then the second gate portion 604 can extend under at least some of at least one of the source region 304 or the drain region 306, such as in a direction illustrated by arrows 116 in FIG. 1, for example. This overextension of the second gate portion 604 results in gate material being situated over a greater area of the semiconductor substrate 308 upon which the device 314 is formed, which can lead to a relatively large parasitic capacitance between the gate and the substrate 308, between the gate and the source region 304, and between the gate and the drain region 306. Accordingly, as provided herein, the second gate portion 604 is aligned with the first gate portion 602 to inhibit the second gate portion 604 from extending over more of the substrate 308.

Figure 3:
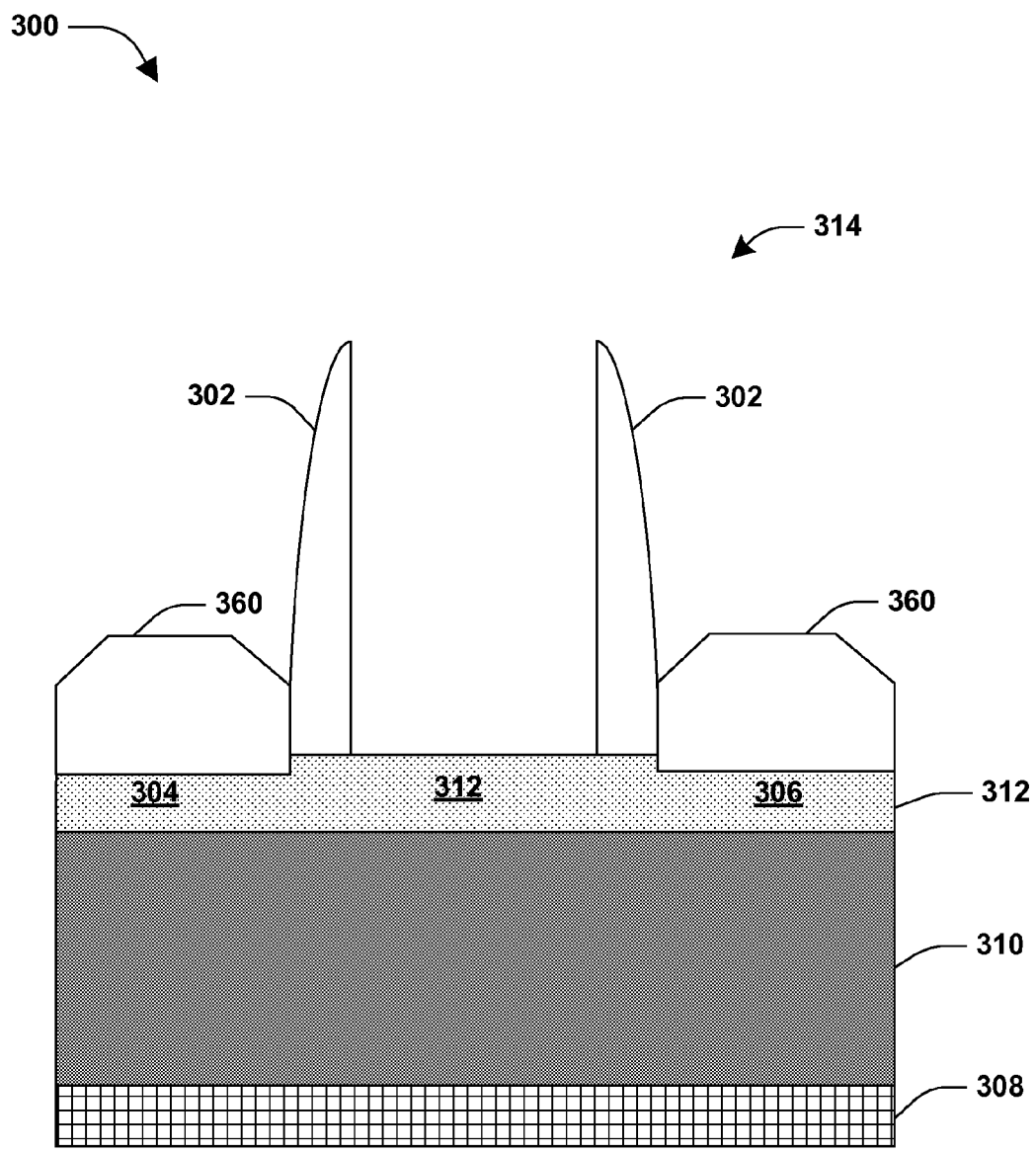
FIG. 3 is an illustration of a semiconductor device comprising a semiconductor layer formed between a substrate and at least some of a first channel, a source region, and/or a drain region of the semiconductor device, according to some embodiments.

In an embodiment of forming the second gate portion 604 that is aligned with the first gate portion 602 of the gate, a semiconductor layer 310 is formed at 204 in FIG. 2 such that the semiconductor layer 310 is situated between the first channel 312 the substrate 308, as illustrated in example 300 of FIG. 3. In an embodiment, the semiconductor layer 310 is formed by an epitaxial growth process. In an example, the semiconductor layer comprises silicon germanium.

Figure 4A:
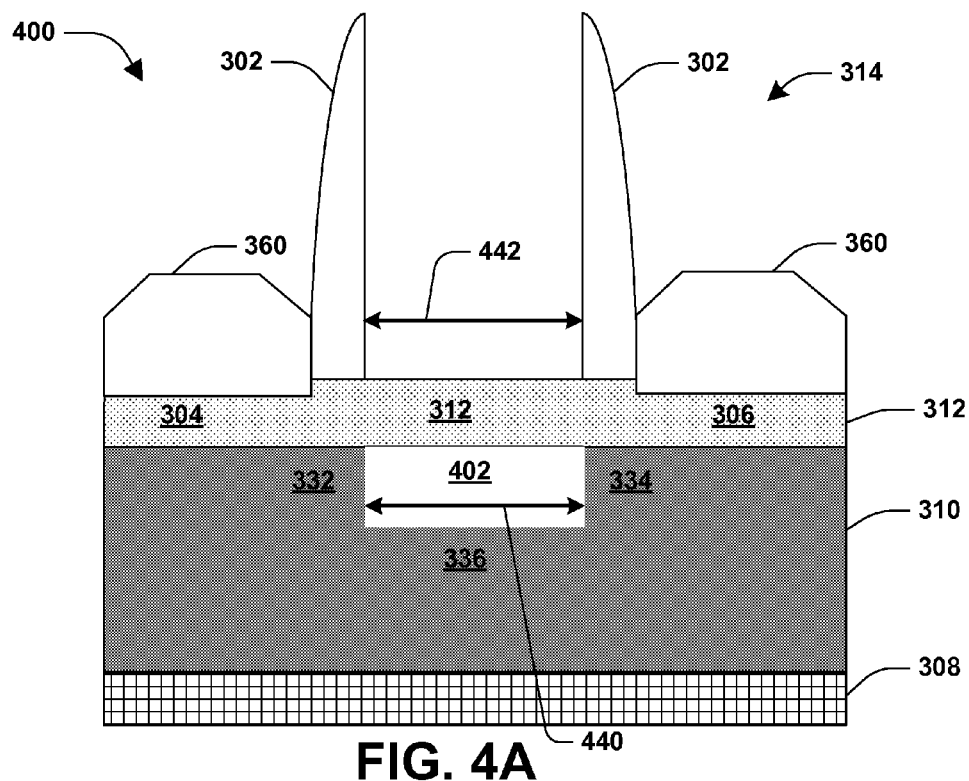
FIG. 4A is an illustration of a semiconductor device comprising a cavity formed within a semiconductor layer of the semiconductor device, according to some embodiments.
Figure 4B:
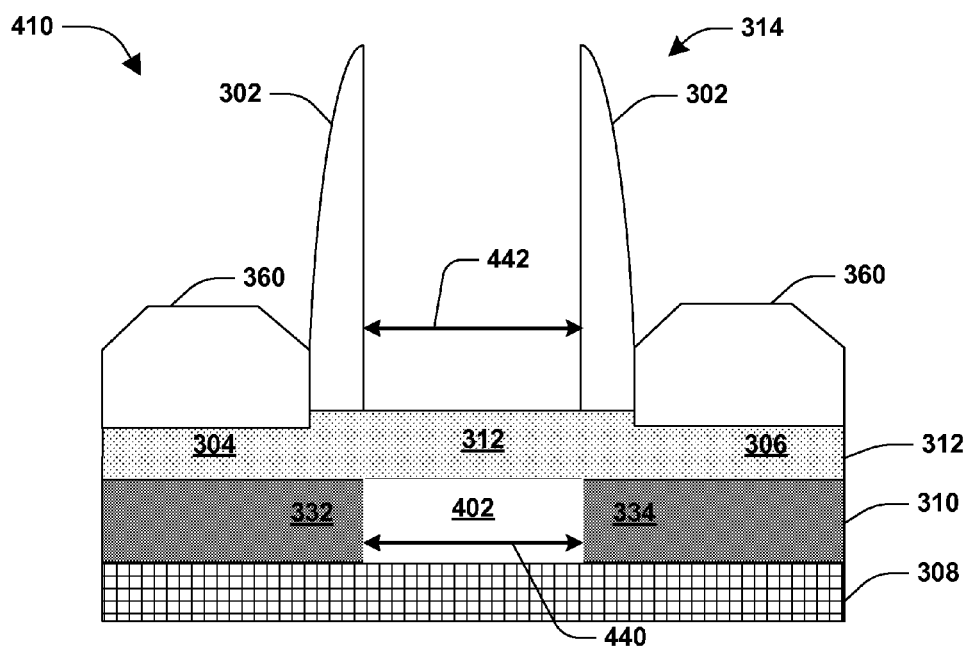
FIG. 4B is an illustration of an example of a semiconductor device comprising a cavity formed within a semiconductor layer of the semiconductor device, according to some embodiments.

At 206, the cavity 402 is formed within the semiconductor layer 310 between the first channel 312 and the substrate 308, as illustrated in example 400 of FIG. 4A and example 410 of FIG. 4B. In an embodiment, the cavity 402 does not extend through the entire thickness of the semiconductor layer 310 down to the substrate 310, as illustrated in example 400 in FIG. 4A. In this way, the cavity 402 is created below the first channel 312, between a first semiconductor portion 332 and a second semiconductor portion 334 of the semiconductor layer 310, and above a third semiconductor portion 336 of the semiconductor layer 310. In another embodiment, the cavity 402 extends through the entire thickness of the semiconductor layer 310 down to the substrate 310, as illustrated in example 410 in FIG. 4B. In this way, the cavity 402 is created below the first channel 312, above the substrate 308, and between the first semiconductor portion 332 and the second semiconductor portion 334 of the semiconductor layer 310, but not above a third semiconductor portion because such a third semiconductor portion has been removed, such as by etching, for example. Various techniques can be used to remove a portion of the semiconductor layer 310 to form the cavity 402, such as by plasma etching, wet etching, etc. In an embodiment, a width 440 of the cavity 402 is sized with respect to a width 442 of an area between first and second spacers 302, where a sacrificial gate is formed in and removed from the area and where the spacers 302 will determine a frame where an interfacial layer (IL), high-k dielectric material and metal gate stack will be formed (FIG. 6A: 608, 606, 602 and 604). Before being removed, the sacrificial gate and the spacers 302 will determine the areas where dopants and epitaxy are used to form the source and drain regions 304, 306. In this way, the cavity 402 defines a region within which the second gate portion 604 will be formed in a self-aligned manner with respect to the first gate portion 602 that is to be formed within at least some of the area between the first and second spacers 302.

Figure 5A:
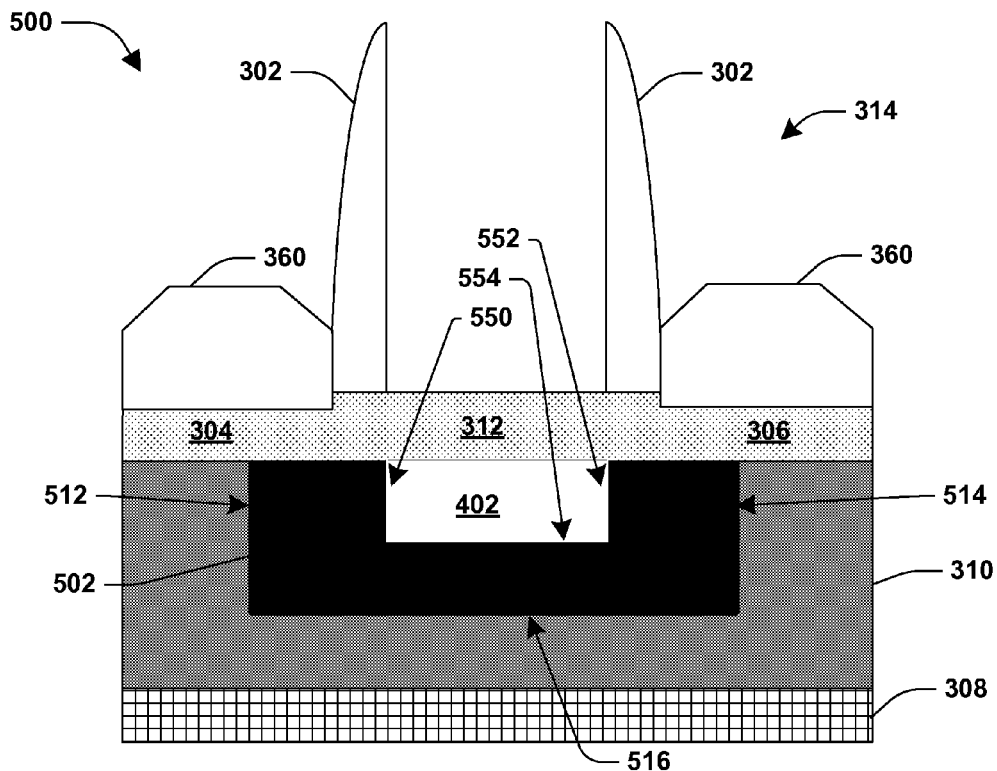
FIG. 5A is an illustration of a semiconductor device comprising a dielectric layer formed around at least some of a cavity of the semiconductor device, according to some embodiments.
Figure 5B:
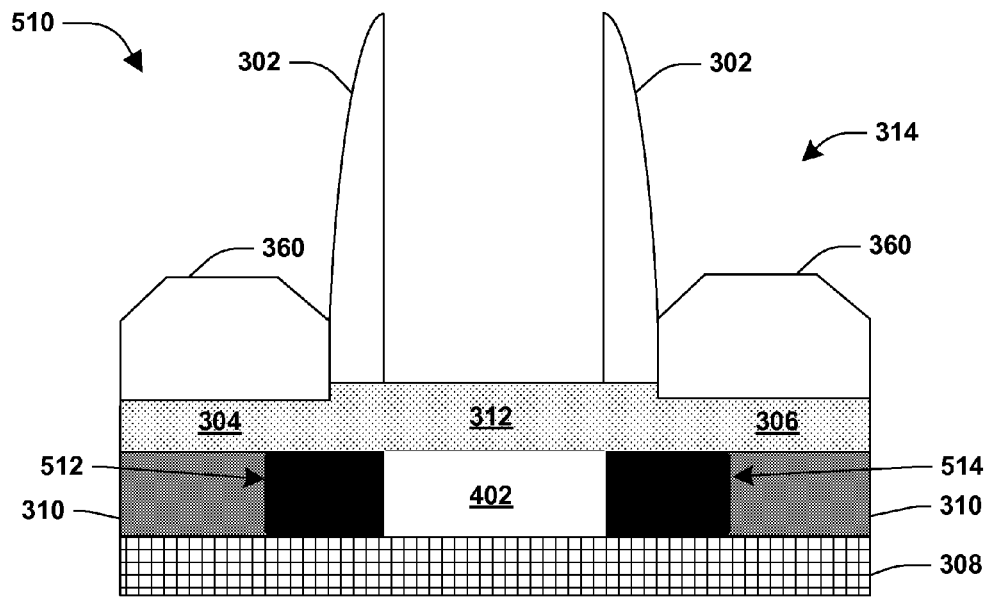
FIG. 5B is an illustration of a semiconductor device comprising a dielectric layer formed around at least some of a cavity of the semiconductor device, according to some embodiments.

At 208, the semiconductor layer 310 is exposed to a reactive agent, such as oxygen, for example, to form a dielectric layer 502 around at least some of the cavity 402, as illustrated in example 500 of FIG. 5A and example 510 of 5B. The dielectric layer 502 extends under at least some of the first channel 312, the source region 304, and/or the drain region 306. In an embodiment where the cavity 402 does not extend through the entire thickness of the semiconductor layer 310, the dielectric layer 502 is formed substantially around a first lateral side 550 of the cavity 402 and a second lateral side 552 of the cavity 402. In an embodiment, the dielectric layer 502 is formed around a lower portion 554 of the cavity 402, as illustrated in FIG. 5A and FIG. 6A. In another embodiment, not illustrated, even though the cavity 402 is not formed all the way through the semiconductor layer 310 down to the substrate 308, the dielectric layer 502 is not formed around the lower portion 554 of the cavity 402, such that the semiconductor layer 310 is disposed between the lower portion 554 and the substrate 308 without intervening dielectric material. In this manner, the dielectric layer can be said to comprise a first dielectric portion 512, a second dielectric portion 514, and a third dielectric portion 516, as illustrated in example 500 of FIG. 5A. In another embodiment where the cavity 402 extends through the entire thickness of the semiconductor layer 310, the dielectric layer 502 merely comprises the first dielectric portion 512 and the second dielectric portion 514 as the dielectric is formed at the first lateral side 550 and the second lateral side 552, but not at a lower portion 554 of the cavity 402, as illustrated in example 510 of FIG. 5B. In an embodiment, a wafer comprises one or more devices, such as an NMOS device, a PMOS device, etc. A first device, such as the NMOS device, comprises a first dielectric layer with a first thickness that is different than a second thickness of a second dielectric layer of a second device, such as the PMOS device.

In this way, dielectric layers of respective devices within the wafer can be formed according to similar or varying thicknesses with respect to one another. Moreover, different portions of a dielectric layer 502 in some instances have different dimensions relative to one another in the same device, or have different dimensions relative to one another in different devices. For example, a first dielectric portion 512, a second dielectric portion 514, and a third dielectric portion 516, for example, have different dimensions, such as thicknesses, for example, within a same device. In another example, a first dielectric portion 512, a second dielectric portion 514, and a third dielectric portion 516, for example, have first respective dimensions in a first device that are different than second respective dimensions of these same portions in a second device. In another example, respective dimensions of one or more of these portions, such as the first dielectric portion 512, for example, is the same in a first device and a second device, while respective dimensions a different of these portions, such as the second dielectric portion 514, for example, are different in the first device and the second device. That is, the first dielectric portion 512 has the same thickness, for example, in the first device and the second device, while the second dielectric portion 514 does not have the same thickness, for example, in the first device and the second device.

In an embodiment, the dielectric layer 502 comprises silicon germanium oxide. The dielectric layer 502 serves as an insulation layer between the semiconductor layer 310 and the second gate portion 604 of the gate that is to be formed within at least a portion of the cavity 402, as illustrated in example 600 of FIG. 6A, example 620 of FIG. 6B, example 630 of FIG. 6C, and/or example 640 of FIG. 6D. In this way, the dielectric layer 502 defines a region within the cavity 402 within which the second gate portion 604 is to be formed. The dielectric layer 502 contains the second gate portion 604 such that the second gate portion 604 is inhibited from being formed over a greater area of the substrate 308, such as under the source region 304 and/or the drain region 306. In this way, the second gate portion 604 will be aligned with the first gate portion 602 of the gate.

Figure 6B:
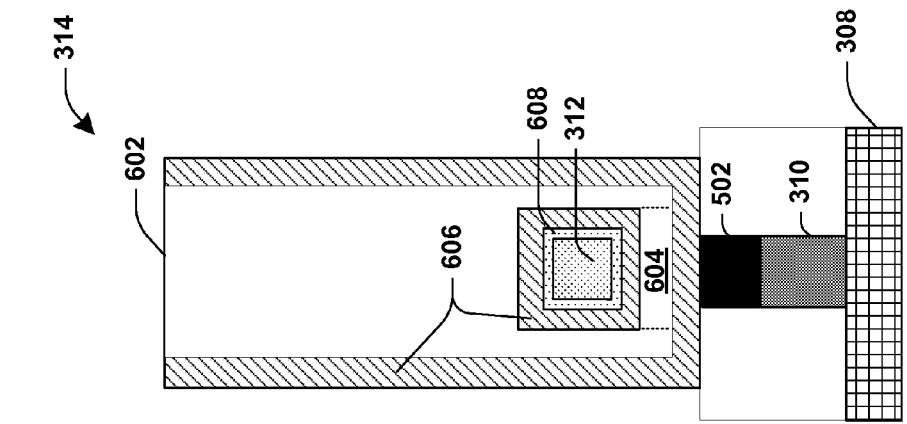
FIG. 6B is an illustration of a cross-sectional view of a semiconductor device taken along line 6B-6B of FIG. 6A, according to some embodiments.
Figure 6A:
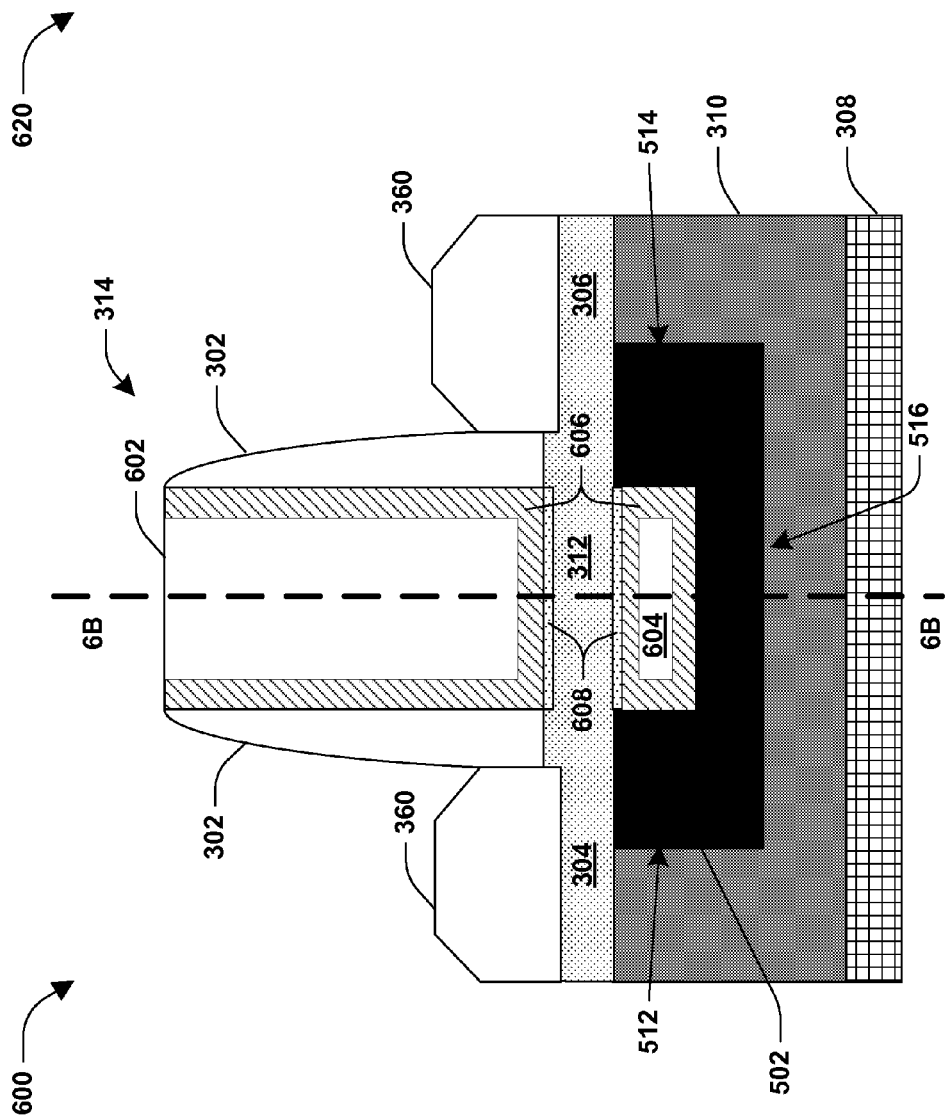
FIG. 6A is an illustration of a semiconductor device comprising a second gate portion aligned with a first gate portion, according to some embodiments.

At 210, the second gate portion 604 is formed within at least some of the cavity 402, as illustrated in example 600 of FIG. 6A, example 620 of FIG. 6B, example 630 of FIG. 6C, and/or example 640 of FIG. 6D. It will be appreciated that FIG. 6B illustrates a cross-sectional view of FIG. 6A taken along line 6B-6B, and that FIG. 6D illustrates a cross-sectional view of FIG. 6C taken along line 6D-6D. In an embodiment where the cavity 402 does not extend through the entire thickness of the semiconductor layer 310, the second gate portion 604 is disposed between the first dielectric portion 512 and the second dielectric portion 514, and between the first channel 312 and the third dielectric portion 516, as illustrated in example 600 of FIG. 6A and example 620 of FIG. 6B. That is, the dielectric layer 502 substantially surrounds a first lateral surface, a second lateral surface, and a lower surface of the second gate portion 604, while the first channel 312 substantially surrounds an upper surface of the second gate portion 604. In an embodiment where the cavity 402 extends through the entire thickness of the semiconductor layer 310, the second gate portion 604 is disposed between the first dielectric portion 512 and the second dielectric portion 514, and between the first channel 312 and the substrate 308, as illustrated in example 630 of FIG. 6C and example 640 of FIG. 6D.

In an embodiment, a high k dielectric material 606 is disposed on the sidewalls of the cavity 402, on top of first channel 312 and inside the spacers 302, as illustrated in examples 610 of FIG. 6A and 620 of FIG. 6B. In an embodiment where the high k dielectric material 606 is formed before the gate, gate material is disposed on the high k dielectric material 606. In another embodiment, the high k dielectric material 606 is disposed around the first channel 312, as illustrated in example 620 of FIG. 6B. In an embodiment, an interfacial layer 608 is formed around the first channel 312 and between the first channel 312 and the high k dielectric material 606 disposed around the first channel 312, as illustrated in FIG. 6B. In an embodiment, the interfacial layer 608 comprises an dielectric material, such as an oxide based material, for example, and provides an interface between the first channel 312 and the high k dielectric material 606, which can suppress mobility degradation of the first channel 312.

In this way, the gate is formed as the gate-all-around structure, such that the first gate portion 602 is formed above the first channel 312, the second gate portion 604 is formed below the first channel 312 and is aligned with the first gate portion 602. In an embodiment, the gate is formed using gate electrode material. The gate electrode material can comprise various types of conductive material, such as metal, metal alloy, metal nitride, metallic oxide, metallic carbide, poly-crystalline silicon, etc. Because the first gate portion 602 and the second gate portion 604 are aligned, the second gate portion 604 is inhibited from extending over more of the substrate 308, which mitigates parasitic capacitance between the gate and the substrate 308 and/or between the gate and the source and drain 304 and 306.

It is appreciated that various materials can be used to form the semiconductor device 314. In an embodiment, the semiconductor layer 310 comprises germanium, the first channel 312 comprises silicon germanium, and the dielectric layer 502 comprises germanium oxide. In another embodiment, the semiconductor layer 310 comprises germanium, the first channel 312 comprises germanium, and the dielectric layer comprises germanium oxide. In another embodiment, the semiconductor layer 310 and the first channel 312 comprise III-V semiconductor material. In this way, various semiconductor stacks and dielectrics can be used to form the semiconductor device 314.

In an embodiment, the semiconductor device 314 comprises a second channel 714, as illustrate in example 700 of FIG. 7A, example 720 of FIG. 7B, example 730 of FIG. 7C, and/or example 740 of FIG. 7D. It will be appreciated that FIG. 7B illustrates a cross-sectional view of FIG. 7A taken along line 7B-7B, and that FIG. 7D illustrates a cross-sectional view of FIG. 7C taken along line 7D-7D. The second channel is disposed between the second gate portion 604 and the substrate 308. In an embodiment, an interface layer 708 is formed around the second channel 714, and a high k dielectric material 708 is disposed around the interface layer 708, as illustrated in FIG. 7B and FIG. 7D.

A third gate portion 704 of the gate is disposed between the second gate portion 604 and the substrate 308. The third gate portion 704 is aligned with the first gate portion 602 and/or the second gate portion 604. In an embodiment where the third gate portion 704 is formed within a cavity that does not extend through the semiconductor layer 310 to the substrate 308, the third gate portion 704 is disposed between the second channel 714 and the dielectric layer 502, as illustrated in example 700 of FIG. 7A and example 720 of FIG. 7B. That is, the dielectric layer 502 substantially surrounds a first lateral surface, a second lateral surface, and a lower surface of the third gate portion 704, while the second channel 714 substantially surrounds an upper surface of the third gate portion 704. In an embodiment where the third gate portion 704 is formed within a cavity that extends through the semiconductor layer 310 to the substrate 308, the third gate portion 704 is disposed between a first dielectric portion 732 and a second dielectric portion 734, and between the second channel 714 and the substrate 308, as illustrated in example 730 of FIG. 7C and example 740 of FIG. 7D. In this way, the third gate portion 704 is self-aligned with the first gate portion 602 and the second gate portion 604.

Among other things, one or more systems and techniques for forming a semiconductor device with an aligned gate are provided herein. In some embodiments, the semiconductor device comprises a gate formed according to a gate-all-around structure around a first channel of the semiconductor device, such that one or more gate portions of the gate surround the first channel. For example, the first channel is formed within a fin, such as a silicon fin, of the semiconductor device. The gate is formed around the first channel, such that a first gate portion substantially surrounds an upper surface of the first channel, a second gate portion substantially surrounds a lower surface of the first channel, a first lateral gate portion substantially surrounds a first lateral surface of the first channel, and a second lateral gate portion substantially surrounds a second lateral surface of the first channel. In this way, the gate is formed according to a gate-all-around structure. It is advantageous to align one or more gate portions with respect to one another. Accordingly, as provided herein, the first gate portion that substantially surrounds the upper surface of the first channel is aligned with the second gate portion that substantially surrounds the lower surface of the first channel. Such alignment mitigates the second gate portion below the first channel from overextending above a substrate of the semiconductor device, such as extending past the first channel and under at least some of a source region and/or a drain region of the semiconductor device, for example, which can result in undesirable parasitic capacitance between the gate and the substrate, between the gate and the source, and between the gate and the drain, for example.

In some embodiments of forming a semiconductor device comprising an aligned gate, a semiconductor layer is formed between a first channel of the semiconductor device and a substrate upon which the semiconductor device is formed. For example, the semiconductor layer comprises silicon germanium or any other semiconductor material. A cavity is formed, such as through plasma-based etching, chemical-based etching, etc., for example, within the semiconductor layer between the first channel and the substrate. The semiconductor layer is exposed to oxygen to form a dielectric layer within or around at least some of the cavity. In some embodiments, the dielectric layer comprises silicon germanium oxide.

The dielectric layer provides an insulation layer at least partly around the cavity so that a second gate portion of the gate below the first channel can be formed within the cavity, such that the second gate portion is aligned with a first gate portion of the gate above the first channel. Accordingly, the second gate portion of the gate is formed within at least some of the cavity. The second gate portion is disposed between the substrate and the first channel. In this way, the second gate portion is formed within the cavity, such that the second gate portion below the first channel is aligned with the first gate portion above the channel because the dielectric layer inhibits the formation of the second gate portion from overextending above the substrate, such as under a source region and/or a drain region of the semiconductor device. In some embodiment, an interface layer is disposed around the first channel, and a high k dielectric material is disposed around the interface layer.

In some embodiments of a multi-channel semiconductor device, the semiconductor device comprises a second channel. The second channel is disposed between the second gate portion of the gate and the substrate. A third gate portion of the gate is disposed between the second channel and the substrate. For example, the third gate portion is formed within a second cavity etched, or otherwise formed, between the second channel and the substrate. In this way, the third gate portion is aligned with the first gate portion and the second gate portion of the gate.

According to an aspect of the instant disclosure, a semiconductor device is provided. The semiconductor device comprises a gate, such as a gate-all-around structure. The semiconductor device comprises a semiconductor layer disposed between a substrate of the semiconductor device and at least some of a first channel, a source region, and/or a drain region of the semiconductor device. A dielectric layer is disposed between the substrate and at least some of the first channel, the source region, and/or the drain region. A first gate portion of the gate is disposed above the first channel. A second gate portion of the gate is disposed between the substrate and the first channel. The second gate portion is aligned with the first gate portion.

According to an aspect of the instant disclosure, a method for fabricating a semiconductor device is provided. The method comprises forming a semiconductor layer between a first channel of the semiconductor device and a substrate upon which the semiconductor device is formed. A cavity is formed within the semiconductor layer between the first channel and the substrate. The semiconductor layer is exposed to oxygen to form a dielectric layer around at least some of the cavity. The dielectric layer extends under at least some of the first channel, a source region, and/or a drain region of the semiconductor device. A second gate portion of the gate is formed within at least some of the cavity. The second gate portion is disposed between the substrate and the first channel. The second gate portion is aligned with a first gate portion of the gate above the first channel.

According to an aspect of the instant disclosure, a semiconductor device is provided. The semiconductor device comprises a gate-all-around structure. The semiconductor device comprises a semiconductor layer disposed between a first channel of the semiconductor device and a substrate upon which the semiconductor device is formed. A dielectric layer is disposed between the semiconductor layer and the first channel. The dielectric layer comprises an oxidized portion of the first semiconductor layer. A first gate portion of the gate-all-around structure is disposed above the first channel. A second gate portion of the gate-all-around structure is disposed between the dielectric layer and the first channel. The second gate portion is aligned with the first gate portion. A second channel is disposed between the second gate portion of the gate-all-around structure and the dielectric layer. A third gate portion of the gate-all-round structure is disposed between the second channel and the dielectric layer. The third gate portion is aligned with the first gate portion and the second gate portion of the gate-all-round structure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as electro chemical plating (ECP), etching techniques, wet remove techniques, implanting techniques, doping techniques, spin-on techniques, sputtering techniques such as magnetron or ion beam sputtering, growth techniques, such as thermal growth, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A semiconductor device, comprising:
  a semiconductor layer disposed on a substrate, wherein at least one of:
    at least some of a first channel of the semiconductor device;
    at least some of a source region of the semiconductor device; or
    at least some of a drain region of the semiconductor device, are disposed on the semiconductor layer;
  a dielectric layer disposed on the substrate and wherein a first portion of the dielectric layer underlies at least some of the source region and a second portion of the dielectric layer underlies at least some of the drain region, wherein the dielectric layer includes an oxide of a semiconductor material of the semiconductor layer; and
  a gate having:
    a first gate portion of the gate including a gate dielectric and a gate electrode disposed above the first channel; and
    a second gate portion including a gate dielectric and a gate electrode of the gate disposed between the substrate and the first channel and aligned with the first gate portion, wherein the second gate portion interposes the first and second portions of the dielectric layer.

2. The semiconductor device of claim 1, the gate comprising a gate-all-around structure.

3. The semiconductor device of claim 1, the semiconductor device configured as a FinFET, tri-gate or multi-gate device.

4. The semiconductor device of claim 1, the second gate portion is disposed between a first dielectric portion of the dielectric layer and a second dielectric portion of the dielectric layer.

5. The semiconductor device of claim 4, the second gate portion disposed between the first channel and a third dielectric portion of the dielectric layer.

6. The semiconductor device of claim 1, wherein at least one of the first channel, the source region, or the drain region is formed within a semiconductor fin of the semiconductor device.

7. The semiconductor device of claim 1, the semiconductor layer comprising silicon germanium.

8. The semiconductor device of claim 1, the dielectric layer comprising silicon germanium oxide.

9. The semiconductor device of claim 1, comprising:
  a second channel disposed between the second gate portion of the gate and the substrate; and
  a third gate portion of the gate disposed between the second channel and the substrate, the third gate portion aligned with the first gate portion and the second gate portion of the gate.

10. A semiconductor device, comprising:
  a first gate portion of a gate structure disposed on a first channel region including a semiconductor material;
  a second gate portion of a gate structure disposed under the first channel region and aligned with the first portion, wherein the second gate portion includes a gate dielectric layer and a gate electrode layer disposed on a second channel region;
  a third gate portion of the gate structure disposed under the second channel and aligned with the second gate portion;
  a first dielectric layer disposed under the first channel region and adjacent each of two opposing sidewalls of the second portion of the gate structure; and
  a second dielectric layer disposed under the second channel region and adjacent each of two opposing sidewalls of the third portion of the gate structure 11. The semiconductor device of claim 10, the second gate portion disposed within a cavity within the first dielectric layer.

12. The semiconductor device of claim 10, the first dielectric layer extending under at least one of:
  at least some of the first channel of the semiconductor device;
  at least some of a source region of the semiconductor device; or
  at least some of a drain region of the semiconductor device.

13. The semiconductor device of claim 10, wherein the first and second dielectric layers include silicon germanium oxide.

14. The semiconductor device of claim 10, wherein
  each of the first gate portion and the third gate portion include a high k dielectric.

15. A method for fabricating a semiconductor device, comprising:
  forming a semiconductor layer on a substrate upon which the semiconductor device is formed;
  providing a first portion of a gate of the semiconductor device over the semiconductor layer, wherein a channel of the semiconductor device is disposed under the first portion of the gate;
  forming a cavity within the semiconductor layer between the channel and the substrate, wherein the cavity is defined by a first sidewall of the semiconductor layer and a second opposing sidewall of the semiconductor layer;

oxidizing the first and second sidewalls to form a first dielectric region and a second dielectric region the first dielectric region extending under at least some of a source region of the semiconductor device and the second dielectric region extending under at least some of a drain region of the semiconductor device; and after oxidizing, forming a second gate portion of the gate of the semiconductor device within at least some of the cavity, the second gate portion disposed between the substrate and the channel, the second gate portion aligned with a first gate portion of the gate above the channel.

16. The method of claim 15, the semiconductor layer comprising silicon germanium.

17. The method of claim 15, comprising:

forming a second channel disposed between the second gate portion of the gate and the substrate; and forming a third gate portion of the gate disposed between the second channel and the substrate, the third gate portion aligned with the first and second gate portions of the gate.

18. The method of claim 15, the forming a second gate portion comprising:

forming the second gate portion between the first dielectric portion and the second dielectric portion of the dielectric layer.

19. The method of claim 15, the second portion of the gate includes a high-k gate dielectric material and a gate electrode material.

* * * * *